(12) United States Patent
Sawada et al.

(10) Patent No.: US 9,831,086 B2
(45) Date of Patent: Nov. 28, 2017

(54) METHOD FOR MANUFACTURING SEMICONDUCTOR SUBSTRATE

(71) Applicant: TOKYO OHKA KOGYO CO., LTD., Kawasaki-shi (JP)

(72) Inventors: Yoshihiro Sawada, Kawasaki (JP); Yu Takahashi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/468,900

(22) Filed: Mar. 24, 2017

(65) Prior Publication Data

US 2017/0287714 A1    Oct. 5, 2017

(30) Foreign Application Priority Data

Mar. 30, 2016   (JP) .................................. 2016-069370

(51) Int. Cl.
| | | |
|---|---|---|
| H01L 21/22 | (2006.01) | |
| H01L 21/225 | (2006.01) | |
| H01L 29/167 | (2006.01) | |

(52) U.S. Cl.
CPC ........ *H01L 21/2252* (2013.01); *H01L 29/167* (2013.01)

(58) Field of Classification Search
CPC ...................................................... H01L 21/22
See application file for complete search history.

(56) References Cited

FOREIGN PATENT DOCUMENTS

| | | |
|---|---|---|
| JP | H06-318559 | 11/1994 |
| WO | WO 2014/064873 | 9/2016 |

*Primary Examiner* — Marvin Payen
(74) *Attorney, Agent, or Firm* — Knobbe Martens Olson & Bear LLP

(57) ABSTRACT

A method for manufacturing a semiconductor substrate that, even when a substrate which has, on a surface thereof, a three-dimensional structure having nanometer-scale microvoids on a surface thereof is used, can allow an impurity diffusion ingredient to be uniformly diffused into the substrate at the whole area thereof where the diffusion agent composition is coated, including the whole inner surfaces of the microvoids, while suppressing the occurrence of defects in the substrate. A coating film having a thickness of not more than 30 nm is formed on a surface of a substrate under such conditions that an atmosphere around the substrate has a relative humidity of not more than 40%, using a diffusion agent composition comprising an impurity diffusion ingredient and a Si compound that is hydrolyzable to produce a silanol group.

6 Claims, No Drawings

METHOD FOR MANUFACTURING SEMICONDUCTOR SUBSTRATE

This application claims priority to Japanese Patent Application No. 2016-069370, filed Mar. 30 2016, the entire content of which is incorporated herein by reference.

BACKGROUND OF THE INVENTION

Field of the Invention

The present invention relates to a method for manufacturing a semiconductor substrate in which an impurity diffusion ingredient is diffused into a semiconductor substrate by a thin film formed using a diffusion agent composition comprising an impurity diffusion ingredient and a Si compound that is hydrolyzable to produce a silanol group.

Related Art

Semiconductor substrates used in semiconductor elements such as transistors diodes and solar batteries are manufactured by diffusing impurity diffusion ingredients such as phosphorus and boron into the semiconductor substrates. For such semiconductor substrates, in the manufacture of semiconductor substrates for multigate elements such as Fin-FET and nanowire FET, in some cases, for example, impurities are diffused into semiconductor substrates having on their surface a three-dimensional structure having nanometer-scale microvoids.

For example, ion implantation (see, for example, Patent Document 1) and CVD (see, for example, Patent Document 2) are known as methods for the diffusion of an impurity diffusion ingredient into the semiconductor substrate. In the ion implantation method, an ionized impurity diffusion ingredient is implanted into a surface of a semiconductor substrate. In the CVD method, an impurity diffusion ingredient is diffused from an oxide film into a semiconductor substrate by forming an oxide film of silicon oxide or the like doped with impurity diffusion ingredients such as phosphorus and boron by CVD and then heating the semiconductor substrate with the oxide film formed thereon in an electric furnace or the like.

Patent Document 1: Japanese Unexamined Patent Application, Publication No. H06-318559

Patent Document 2: PCT International Publication No. WO2014/064873

SUMMARY OF THE INVENTION

In an ion implantation method disclosed in Patent Document 1, however, when light ions like B (boron) are implanted into a semiconductor substrate, point defects and point defect clusters are likely to be formed in areas near the surface of the substrate, while, when heavy ions such as As are implanted, a noncrystalline area is likely to be formed in an area around the surface of the substrate. For example, when CMOS elements such as CMOS image sensors are formed by diffusing an impurity diffusion ingredient into a semiconductor substrate by the ion implantation method, the occurrence of such defects is directly linked to deterioration of performance of elements. The occurrence of such defects in CMOS image sensors poses a problem of dropouts.

Further, when the semiconductor substrate has on its surface a three-dimensional structure such as a nano-scale three-dimensional structure for the formation of a multigate element called Fin-FET comprising a plurality of source fins, a plurality of drain fins, and a gate vertical to these fins, in the ion implantation method, difficulties are encountered in uniformly implanting ions into a side surface and an upper surface of the fins and the gate, and the whole inner surface of concaves surrounded by the fins and the gate. In the diffusion of the impurity diffusion ingredient by the ion implantation method into the semiconductor substrate having a nano-scale three-dimensional structure, even when ions could have been uniformly implanted, the following problem occurs. For example, when logic LSI devices and the like are formed using a semiconductor substrate having a three-dimensional pattern comprising fine fins, crystals of substrate materials such as silicon are likely to be broken by ion implantation. Such damage to the crystals is considered to cause problems of a variation in properties of the device and the occurrence of stand-by leak current.

Further, the application of the CVD method as described in Patent Document 2 poses a problem of, due to an overhang phenomenon, difficulties encountered in covering the whole inner surface of concaves surrounded by the fins and the gate with an oxide film that is uniform in thickness and contains an impurity diffusion ingredient, as well as a problem of an oxide being deposited in openings of concaves surrounded by the fins and the gate thereby blocking the openings. Thus, in the ion implantation method and the CVD method, an impurity diffusion ingredient cannot be diffused well and uniformly on semiconductor substrates without difficulties, depending upon surface shapes of the semiconductor substrate.

The present invention has been made in view of the above problems, and an object of the present invention is to provide a method for manufacturing a semiconductor substrate that, even when a semiconductor substrate which has, on a surface thereof, a three-dimensional structure having nanometer-scale microvoids on a surface thereof is used, can allow an impurity diffusion ingredient to be well and uniformly diffused into the whole area of the semiconductor substrate where the diffusion agent composition is coated, including the whole inner surfaces of the microvoids, while suppressing the occurrence of defects in the semiconductor substrate.

The present inventors have focused on the fact that, when a coating film formed of a coatable diffusion agent composition is heated to diffuse an impurity diffusion ingredient into a semiconductor substrate, the occurrence of defects in the semiconductor substrate observed in the ion implantation method can be suppressed, which has led to the start of studies. As a result, the present inventors have found that, when a diffusion agent composition comprising an impurity diffusion ingredient (A) and a Si compound (B) that is hydrolyzable to produce a silanol group is used, the formation of a coating film having a thickness of not more than 30 nm on a surface of a semiconductor substrate using the diffusion agent composition under such conditions that an atmosphere around the semiconductor substrate has a relative humidity of not more than 40% can allow the impurity diffusion ingredient to be well and uniformly diffused into the semiconductor substrate from the coating film, which has led to the completion of the present invention.

Specifically, the present invention relates to a method for manufacturing a semiconductor substrate, the method comprising:

coating a diffusion agent composition on a semiconductor substrate I that is an object into which an impurity diffusion ingredient (A) is to be diffused, to form a coating film having a thickness of not more than 30 nm; and diffusing the impurity diffusion ingredient (A) in the diffusion agent composition into the semiconductor substrate I, wherein the diffusion agent composition contains the impurity diffusion ingredient (A) and a Si compound (B) that is hydrolyzable to produce a silanol group, and in coating the diffusion agent composition, an atmosphere around the semiconductor substrate I has a relative humidity of not more than 40%.

The present invention can provide a method for manufacturing a semiconductor substrate that, even when a semiconductor substrate which has, on a surface thereof, a three-dimensional structure having nanometer-scale microvoids on a surface thereof is used, can allow an impurity diffusion ingredient to be well and uniformly diffused into the semiconductor substrate at the whole area of the semiconductor substrate where the diffusion agent composition is coated, including the whole inner surfaces of the microvoids, while suppressing the occurrence of defects in the semiconductor substrate.

The method for manufacturing a semiconductor substrate comprises: coating a diffusion agent composition on a semiconductor substrate I that is an object into which an impurity diffusion ingredient (A) is to be diffused, to form a coating film having a thickness of not more than 30 nm; and diffusing the impurity diffusion ingredient (A) in the diffusion agent composition into the semiconductor substrate I. The diffusion agent composition comprises an impurity diffusion ingredient (A) and a Si compound (B) that is hydrolyzable to produce a silanol group. Hereinafter, the step of forming a coating film having a thickness of not more than 30 nm is referred to also as a "coating step," and the step of diffusing the impurity diffusion ingredient (A) is referred to also as a "diffusion step". The coating step and the diffusion step will be described in the mentioned order.

<<Coating Step>>

In the coating step, a diffusion agent composition is coated on a semiconductor substrate I to form a coating film having a thickness of not more than 30 nm. Regarding the coating step, the diffusion agent composition, the semiconductor substrate I, and the coating method will be described in the mentioned order.

<Diffusion Agent Composition>

The diffusion agent composition comprises an impurity diffusion ingredient (A) and a Si compound (B) that is hydrolyzable to produce a silanol group. In the present specification, the Si compound (B) that can produce a silanol group is referred to also as a hydrolyzable silane compound (B). Indispensable or optional ingredients contained in the diffusion agent composition will be described hereinafter.

[Impurity Diffusion Ingredient (A)]

The impurity diffusion ingredient (A) is not particularly limited as long as the ingredient is one that has hitherto been used for doping of semiconductor substrates. The impurity diffusion ingredient (A) may be either an n-type dopant or a p-type dopant. Elementary substances such as phosphorus, arsenic, and antimony and compounds containing these elements may be mentioned as the n-type dopant. Elementary substances such as boron, gallium, indium, and aluminum and compounds containing these elements may be mentioned as the p-type dopant.

The impurity diffusion ingredient (A) is preferably a phosphorus compound, a boron compound, or an arsenic compound from the viewpoints of easy availability and handleability. Preferred phosphorus compounds include phosphoric acid, phosphorous acid, hypophosphorous acid, polyphosphoric acid, and diphosphorus pentaoxide, phosphorous acid esters, phosphoric acid esters, phosphorous acid tris (trialkylsilyl), and phosphoric acid tris(trialkylsilyl). Preferred boron compounds include boric acid, metaboric acid, boronic acid, perboric acid, hypoboric acid, diboron trioxide, and trialkyl borate. Preferred arsenic compounds include arsenic acid and trialkyl arsenate.

Preferred phosphorus compounds include phosphorous acid esters, phosphoric acid esters, tris(trialkylsilyl) phosphite, and tris(trialkylsilyl) phosphate. Among these, trimethyl phosphate, triethyl phosphate, trimethyl phosphite, triethyl phosphite, tris(trimethoxysilyl) phosphate, and tris(trimethoxysilyl) phosphite are preferred. Trimethyl phosphate, trimethyl phosphite, and tris(trimethylsilyl) phosphate are more preferred, and trimethyl phosphate is particularly preferred.

Preferred boron compounds include trimethoxyboron, triethoxyboron, trimethylboron, triethylboron, and trimethylamine borane.

Preferred arsenic compounds include arsenic acid, triethoxyarsenic, and tri-n-butoxyarsenic.

The content of the impurity diffusion ingredient (A) in the diffusion agent composition is not particularly limited. The content of the impurity diffusion ingredient (A) in the diffusion agent composition is such that the amount (moles) of elements that act as a dopant in a semiconductor substrate such as phosphorus, arsenic, antimony, boron, gallium, indium, and aluminum contained in the impurity diffusion ingredient (A) is preferably 0.01 to 5 times, more preferably 0.05 to 3 times, as large as the number of moles of Si contained in the hydrolyzable silane compound (B).

[Hydrolyzable Silane Compound (B)]

The diffusion agent composition contains a hydrolyzable silane compound (B). By virtue of this constitution, when the diffusion agent composition is applied onto a semiconductor substrate I to form a thin film, the hydrolyzable silane compound is subjected to hydrolysis condensation to form a silicon oxide-based very thin film within the coating film. When the silicon oxide-based very thin film is formed within the coating film, external diffusion of the impurity diffusion ingredient (A) on the outside of the substrate is suppressed. In this case, even when the film of the diffusion agent composition is a thin film, the impurity diffusion ingredient (A) is diffused well and uniformly into the semiconductor substrate.

The hydrolyzable silane compound (B) produces a hydroxyl group as a result of hydrolysis and has a functional group bondable to a Si atom. Functional groups that produce a hydroxyl group as a result of hydrolysis include alkoxy, isocyanate, and dimethylamino groups and halogen atoms. Straight-chain or branched-chain aliphatic alkoxy groups having 1 to 5 carbon atoms are preferred as the alkoxy group. Specific examples of suitable alkoxy groups include methoxy, ethoxy, n-propoxy, isopropoxy, and n-butoxy groups. Preferred halogen atoms are chlorine, fluorine, bromine, and iodine atoms, and the chlorine atom is more preferred.

The functional group that produces a hydroxyl group as a result of hydrolysis is preferably an isocyanate group and straight-chain or branched-chain aliphatic alkoxy group having 1 to 5 carbon atoms, more preferably methoxy, ethoxy, and isocyanate groups, from the viewpoints of rapid hydrolysis and handleability and availability of the hydrolyzable silane compound (B).

Specific examples of the hydrolyzable silane compound (B) having a straight-chain or branched-chain aliphatic alkoxy groups having 1 to 5 carbon atoms include tetramethoxysilane, tetraethoxysilane, tetra-n-propoxysilane, tetraisopropoxysilane, tetra-n-butoxysilane, tetra-n-pentyloxysilane, trimethoxymonoethoxysilane, dimethoxydiethoxysilane, monomethoxytriethoxysilane, trimethoxymono-n-propoxysilane, dimethoxydi-n-propoxysilane, monomethoxytri-n-propoxysilane, trimethoxymono-n-butoxysilane, dimethoxydi-n-butoxysilane, monomethoxytri-n-tributoxysilane, trimethoxymono-n-pentyloxysilane, dimethoxydi-n-pentyloxysilane, monomethoxytri-n-pentyloxysilane, triethoxymono-n-propoxysilane, diethoxydi-n-propoxysilane, monoethoxytri-n-propoxysilane, triethoxymono-n-butoxysilane, diethoxydi-n-butoxysilane, monoethoxytri-n-butoxysilane, triethoxymono-n-pentyloxysilane, diethoxydi-n-pentyloxysilane, monoethoxytri-n-pentyloxysilane, tri-n-propoxymono-n-butoxysilane, di-n-propoxydi-n-butoxysilane, mono-n-propoxytri-n-propoxysilane, tri-n-propoxy mono-n-pentyloxysilane, di-n-propoxydi-n-pentyloxysilane, mono-n-propoxytri-n-pentyloxysilane, tri-n-butoxy mono-n-pentyloxysilane, di-n-butoxydi-n-pentyloxysilane, mono-n-butoxytri-n-pentyloxysilane, methyltrimethoxysilane, methyltriethoxysilane, methyltri-n-propoxysilane, methyltri-n-propoxysilane, methyltri-n-butoxysilane, methyltri-n-pentyloxysilane, ethyltrimethoxysilane, ethyltriethoxysilane, ethyltri-n-propoxysilane, ethyltri-n-butoxysilane, and ethyltri-n-pentyloxysilane. These hydrolyzable silane compounds (B) may be used solely or in a combination of two or more of these. Further, partial hydrolyzates of the alkoxysilane compounds may also be used as the hydrolyzable silane compound (B).

Among these, tetramethoxysilane, tetraethoxysilane, methyltrimethoxysilane, methyltriethoxysilane, ethyltrimethoxysilane, and ethyltriethoxysilane are preferred, and tetramethoxysilane and tetraethoxysilane are particularly preferred.

Compounds represented by the following formula (1) are preferred as the isocyanate-group-containing hydrolyzable silane compound (B).

$$R_{4-n}Si(NCO)_n \quad (1)$$

wherein R represents a hydrocarbon group; and n is an integer of 3 or 4.

The hydrocarbon group as R in the formula (1) is not particularly limited as long as the object of the present invention is not impeded. Preferably, R represents an aliphatic hydrocarbon group having 1 to 12 carbon atoms, an aromatic hydrocarbon group having 1 to 12 carbon atoms, or an aralkyl group having 1 to 12 carbon atoms.

Examples of suitable aliphatic hydrocarbon groups having 1 to 12 carbon atoms include methyl, ethyl, n-propyl, isopropyl, n-butyl, sec-butyl, isobutyl, tert-butyl, n-pentyl, isopentyl, neopentyl, cyclopentyl, n-hexyl, cyclohexyl, n-heptyl, cycloheptyl, n-octyl, cyclooctyl, n-nonyl, n-decyl, n-undecyl, and n-dodecyl groups.

Examples of suitable aromatic hydrocarbon groups having 1 to 12 carbon atoms include phenyl, 2-methylphenyl, 3-methylphenyl, 4-methylphenyl, 2-ethylphenyl, 3-ethylphenyl, 4-ethylphenyl, α-naphthyl, β-naphthyl, and biphenylyl groups.

Examples of suitable aralkyl groups having 1 to 12 carbon atoms include benzyl, phenetyl, α-naphthylmethyl, β-naphthylmethyl, 2-α-naphthylethyl, and 2-β-naphthylethyl groups.

Among the above-described hydrocarbon atoms, methyl and ethyl groups are preferred, and a methyl group is more preferred.

Among the hydrolyzable silane compounds (B) represented by the formula (1), tetraisocyanatesilane, methyltriisocyanatesilane, and ethyltriisocyanatesilane are preferred, and tetraisocyanatesilane is more preferred.

The hydrolyzable silane compound (B) containing an isocyanate group and the hydrolyzable silane compound (B) containing a straight-chain or branched-chain aliphatic alkoxy group having 1 to 5 carbon atoms may also be used in combination. In this case, the ratio X/Y between the number of moles X of the hydrolyzable silane compound (B) containing an isocyanate group and the number of moles Y of the hydrolyzable silane compound (B) containing a straight-chain or branched-chain aliphatic alkoxy group having 1 to 5 carbon atoms is preferably 1/99 to 99/1, more preferably 50/50 to 95/5, particularly preferably 60/40 to 90/10.

The content of the hydrolyzable silane compound (B) in the diffusion agent composition is preferably 0.001 to 3.0% by mass, more preferably 0.01 to 1.0% by mass, in terms of Si concentration. When the diffusion agent composition contains the hydrolyzable silane compound (B) at this concentration, external diffusion of the impurity diffusion ingredient (A) from the thin coating film formed using the diffusion agent composition can be well suppressed, and the impurity diffusion ingredient can be diffused well and uniformly into the semiconductor substrate I.

[Organic Solvent (S)]

The diffusion agent composition usually contains an organic solvent (S) as a solvent so that a thin coating film can be formed. The type of the organic solvent (S) is not particularly limited as long as the object of the present invention is not impeded.

The diffusion agent composition contains the hydrolyzable silane compound (B) and thus is preferably substantially free from water. The expression "the diffusion agent composition is preferably substantially free from water" means that the diffusion agent composition does not contain water in such an amount that the hydrolysis proceeds to a level that impedes the object of the present invention.

Specific examples of organic solvents (S) include: mono ethers of glycols such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monophenyl ether, dipropylene glycol monomethyl ether, dipropylene glycol monoethyl ether, dipropylene glycol monopropyl ether, dipropylene glycol monobutyl ether, dipropylene glycol monophenyl ether, triethylene glycol monomethyl ether, triethylene glycol monoethyl ether, tripropylene glycol monomethyl ether, and tripropylene glycol monoethyl ether; monoethers such as diisopentyl ether, diisobutyl ether, benzyl methyl ether, benzyl ethyl ether, dioxane, tetrahydrofuran, anisole, perfluoro-2-butyltetrahydrofuran, and perfluorotetrahydrofuran; chain diethers of glycols such as ethylene glycol dimethyl ether, ethylene glycol diethyl ether, ethylene ethylene glycol dipropyl ether, ethylene glycol dibutyl ether, propylene glycol dimethyl ether, propylene glycol diethyl ether, propylene glycol dipropyl ether, propylene glycol dibutyl ether, diethylene glycol dimethyl ether, diethylene glycol diethyl ether, diethylene glycol dipropyl ether, diethylene glycol dibutyl ether, dipropylene glycol dimethyl ether, dipropylene glycol diethyl ether, dipropylene glycol dipropyl ether, and dipropylene glycol dibutyl ether; cyclodiethers such as 1,4-dioxane; ketones such as 1-octanone, 2-octanone, 1-nonanone, 2-nonanone, acetone, 2-heptanone, 4-heptanone, 1-hexanone, 2-hexanone, 3-pentanone, diisobutyl ketone, cyclohexanone, methylcyclohexanone, phenylacetone, methylethyl ketone, methylisobutyl ketone, ethylisobutyl ketone, acetylacetone, acetonylacetone, ionone, diacetonyl alcohol, acetyl carbinol, acetophenone, methyl naphthyl ketone, and isophorone; esters such as methyl acetate, butyl acetate, ethyl acetate, isopropyl acetate, pentyl acetate, isopentyl acetate, methoxy ethyl acetate, ethoxy ethyl acetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, propylene glycol monomethyl ether acetate, propylene glycol monoethyl ether acetate, propylene glycol monopropyl ether acetate, propylene glycol monobutyl ether acetate, propylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methylpyrubate, ethylpyrubate, propylpyrubate, butyl pyrubate, methyl acetoacetate, ethyl acetoacetate, methyl propionate, ethyl propionate, propyl propionate, isopropyl propionate, methyl-3-methoxypropionate, ethyl-3-methoxypropionate, ethyl-3-ethoxypropionate, propyl-3-methoxy propionate, and isopropyl-3-methoxypropionate, propylene carbonate, and γ-butyrolactone; amide-based solvents containing no active hydrogen atom, such as N-methyl-2-pyrrolidone, N,N-dimethylacetamide, N,N-dimethylformamide, hexamethylphosphoric triamide, and 1,3-dimethyl-2-imidazolidinone; sulfoxides such as dimethyl sulfoxide; aliphatic hydrocarbon-based solvents optionally containing a halogen atom such as pentane, hexane, octane, decane, 2,2,4-trimethylpentane, 2,2,3-trimethylhexane, perfluorohexane, perfluoroheptane, limonene, and pinene; aromatic hydrocarbon-based solvents such as benzene, toluene, xylene, ethylbenzene, propylbenzene, 1-methylpropylbenzene, 2-methylpropylbenzene, diethylbenzene, ethylmethylbenzene, trimethylbenzene, ethyldimethylbenzene, and dipropylbenzene; monovalent alcohols such as methanol, ethanol, n-propanol, isopropanol, butanol, isobutanol, 2-methoxyethanol, 2-ethoxyethanol, 3-methyl-3-methoxybutanol, hexanol, cyclohexanol, benzyl alcohol, and 2-phenoxyethanol; and glycols such as ethylene glycol, propylene glycol, diethylene glycol, and dipropylene glycol. In the above examples of preferred organic solvent (S), organic solvents containing an ether bond and an ester bond are classified in esters. They may be used solely or in a combination of two or more of these.

Since the diffusion agent composition contains the hydrolyzable silane compound (B), preferably the (S) organic solvent does not have a functional group reactive with the hydrolyzable silane compound (B). In particular, when the hydrolyzable silane compound (B) contains an isocyanate group, preferably the (S) solvent does not have a functional group reactive with the hydrolyzable silane compound (B).

Functional groups reactive with the hydrolyzable silane compound (B) include both functional groups reactive directly with groups that are hydrolyzable to produce a hydroxyl group, and functional groups reactive with a hydroxyl group (a silanol group) produced by hydrolysis. Examples of functional groups reactive with the hydrolyzable silane compound (B) include a hydroxyl group, a carboxyl group, an amino group, and halogen atoms.

Examples of suitable organic solvents that do not have a functional group reactive with the hydrolyzable silane compound (B) include, among the specific examples of the organic solvent (S), monoethers, chain diethers, ketones, esters, amide-based solvents that do not have an active hydrogen atom, sulfoxides, and aliphatic hydrocarbon-based solvents that may contain a halogen, and organic solvent recited as specific examples of aromatic hydrocarbon-based solvents.

[Other Ingredients]

The diffusion agent composition may contain various additives such as surfactants, antifoaming agents, pH adjustors, and viscosity modifiers as long as the object of the present invention is not impaired. Further, the diffusion agent composition may contain binder resins with a view to improving the coatability and film forming properties. Various resins may be used as the binder resin, and acrylic resins are preferred.

<Semiconductor Substrate I>

Various substrates that have hitherto been used as a target of diffusion of an impurity diffusion ingredient may be used as the semiconductor substrate I without limitation. Silicon substrates are typically used as the semiconductor substrate I.

The semiconductor substrate I may have a three-dimensional structure on its surface onto which the diffusion agent composition is to be applied. According to the present invention, even when the semiconductor substrate I has on its surface the three-dimensional structure, particularly a three-dimensional structure having a nano-scale micropattern, the impurity diffusion ingredient can be diffused well and uniformly into the semiconductor substrate I by coating the diffusion agent composition to form a thin coating film having a thickness of not more than 30 nm on the semiconductor substrate I.

The shape of the pattern is not particularly limited, however typical examples thereof include linear or curved lines or grooves of a rectangular cross section and hole shapes formed by removing a circular or rectangular cylindrical shape.

When the semiconductor substrate I has on its surface a repeating pattern of a plurality of parallel lines as the three-dimensional structure, an interval between the lines may be not more than 60 nm, not more than 40 nm, or not more than 20 nm. The height of the lines may be not less than 30 nm, not less than 50 nm, or not less than 100 nm.

<Coating Method>

The diffusion agent composition is coated onto the semiconductor substrate I so that the thickness of the coating film formed using the diffusion agent composition is not more than 30 nm, preferably 0.2 to 10 nm. The diffusion agent composition is coated under such conditions that the relative humidity of an atmosphere around the semiconductor substrate I is not more than 40%, preferably not more than 30%. When the coating film is formed under an atmosphere having the above humidity, the impurity diffusion ingredient (A) can be diffused better into the semiconductor substrate I from the coating film formed using the diffusion agent composition, although the mechanism has not been elucidated yet.

In coating the diffusion agent composition, the lower limit of the relative humidity of the atmosphere around the semiconductor substrate I is not particularly limited as long as the impurity diffusion ingredient (A) can be well diffused, but is preferably 5% or more, more preferably 10% or more. Moisture in the atmosphere is necessary for the hydrolysis of the hydrolyzable silane compound (B). When the relative humidity of the atmosphere is excessively low, a reaction by which the coating film is converted to a silica-based film does not proceed satisfactorily, and, thus, there is a possibility that the impurity diffusion ingredient (A) is diffused into the outside of the semiconductor substrate I.

The relative humidity around the semiconductor substrate I may be regulated by any method without particular limitation. Examples of such methods include a method in which a coating apparatus is installed in a humidity-controllable room, and a method in which an environment where the coating of the diffusion agent composition on the semiconductor substrate I is performed is surrounded by a wall or a sheet with as less gaps as possible to regulate the relative humidity within the space surrounded by a commercially available humidity controlling apparatus to a value within a predetermined humidity range.

In coating the diffusion agent composition, the temperature of an atmosphere around the semiconductor substrate I is preferably regulated to not more than 23° C. There is a tendency that the diffusion of the impurity diffusion ingredient (A) proceeds better when the temperature of the atmosphere is lower.

The method for coating the diffusion agent composition is not particularly limited as long as a coating film having a desired thickness can be formed. Preferred coating methods for the diffusion agent composition include spin coating, ink jet coating, and spray coating, and spin coating is more preferred. The thickness of the coating film is an average of thickness values measured at five or more points with an ellipsometer.

The thickness of the coating film is appropriately set to any desired thickness of not more than 30 nm depending upon the shape of the semiconductor substrate I and a degree of diffusion of the impurity diffusion ingredient (A) determined as desired.

After the application of the diffusion agent composition onto the surface of the semiconductor substrate I, the surface of the semiconductor substrate I is preferably rinsed with an organic solvent. The thickness of the coating film can be made further uniform by rinsing the surface of the semiconductor substrate I after the formation of the coating film. In particular, when the semiconductor substrate I has on its surface a three-dimensional structure, the thickness of the coating film is likely to be thick at the bottom (stepped portion) of the three-dimensional structure. However, the thickness of the coating film can be made uniform by rinsing the surface of the semiconductor substrate I after the formation of the coating film.

Organic solvents that may be contained in the diffusion agent composition may be used as the organic solvent for rinsing.

<<Diffusion Step>>

In the diffusion step, the impurity diffusion ingredient (A) contained in the thin coating film formed on the semiconductor substrate I using the diffusion agent composition is diffused into the semiconductor substrate I. Any method may be used without particular limitation for the diffusion of the impurity diffusion ingredient (A) into the semiconductor substrate I as long as the impurity diffusion ingredient (A) can be diffused from the coating film formed of the diffusion agent composition by heating.

A typical method is to heat a semiconductor substrate I with a coating film of a diffusion agent composition formed thereon in a heating furnace such as an electric furnace. Conditions for heating are not particularly limited as long as the impurity diffusion ingredient is diffused to a desired extent.

In general, after the removal of organic materials in the coating film by firing under an atmosphere of an oxidizing gas, the semiconductor substrate I is heated under an atmosphere of an inert gas to diffuse the impurity diffusion ingredient into the semiconductor substrate I. Heating for the removal of the organic materials by firing is preferably carried out at a temperature of approximately 300 to 1000° C., more preferably 400 to 800° C., preferably for 1 to 120 min, more preferably for 5 to 60 min. Heating for the diffusion of the impurity diffusion ingredient is preferably carried out at 800 to 1400° C., more preferably at 800 to 1200° C., preferably for 1 to 120 min, more preferably for 5 to 60 min.

When the temperature of the semiconductor substrate I can be rapidly raised at 25° C./sec or more to a predetermined diffusion temperature, the holding time of the diffusion temperature may be not more than 30 sec, not more than 10 sec, or even a very short time of less than 1 sec. In this case, the impurity diffusion ingredient can easily be diffused at a high concentration in a shallow region in the surface of the semiconductor substrate I.

According to the method described above, even when a semiconductor substrate I having on its surface a three-dimensional structure with nano-scale microvoids is used, the impurity diffusion ingredient can be diffused well and uniformly into the semiconductor substrate I while suppressing the occurrence of defects. Accordingly, the method according to the present invention is suitable for use in the manufacture of multigate elements having a three-dimensional microstructure. The method according to the present invention can suppress the occurrence of defects in the semiconductor substrate during the diffusion of the impurity diffusion ingredient and thus is particularly suitable for use in the manufacture of CMOS elements such as CMOS image sensors, logic LSI devices.

EXAMPLES

The following Examples further illustrate the present invention but should not be construed as limiting the present invention.

Examples 1-4

A diffusion agent composition comprising 0.35% by mass of tetraisocyanatesilane and 0.237% by mass of tri-n-butoxyarsenic in n-butyl acetate was prepared.

Coating films having thicknesses described in Table 1 were formed on a silicon substrate having a flat surface (4 inches, p-type) with a spin coater while regulating the relative humidity of an atmosphere around the spin coater to a value described in Table 1 and regulating the rotation speed at 23° C. After the spin coating, the coating film was rinsed with n-butyl acetate.

After the formation of the coating film, the impurity diffusion ingredient was subjected to diffusion treatment by the following method. At the outset, the coating films were baked on a hot plate. Subsequently, the baked coating films were heated at a temperature rise rate of 25° C./sec under a nitrogen atmosphere at a flow rate of 1 L/m with a rapid thermal annealing apparatus (a lamp annealing apparatus), and diffusion was carried out under conditions of 1000° C. and a holding time of 5 sec. After the completion of the diffusion, the semiconductor substrate was rapidly cooled to room temperature. For the diffusion-treated silicon substrates, the sheet resistance was measured at 25 points, and the average of the obtained values was determined. The averages of the sheet resistance values are described in Table 1.

TABLE 1

|  | Relative humidity | Thickness of coating film (nm) | Sheet resistance (ohm/sq.) |
| --- | --- | --- | --- |
| Example 1 | 30% | 4.7 | 388 |
| Example 2 | 30% | 4.3 | 445 |
| Example 3 | 30% | 6.0 | 280 |
| Example 4 | 40% | 6.0 | 312 |
| Comparative example 1 | 50% | 4.0 | 931 |

It is apparent from comparison of Examples 1 to 4 with Comparative Example 1 that the impurity diffusion ingredient can be well diffused by regulating the relative humidity in the coating film formation to not more than 40%. As described above, according to the methods in Examples 1 to 4, the impurity diffusion ingredient can be well diffused, for example, from a very thin coating film having a thickness of not more than 10 nm. Thus, according to the methods in Examples 1 to 4, even when a semiconductor substrate I which has, on a surface thereof, a three-dimensional structure having nanometer-scale microvoids on a surface thereof is used, a very thin coating film can be uniformly formed on the whole area of a surface of the substrate including the inner surfaces of the microvoids, thereby allowing an impurity diffusion ingredient to be well and uniformly diffused into the semiconductor substrate I.

What is claimed is:

1. A method for manufacturing a semiconductor substrate, the method comprising:
coating a diffusion agent composition on a semiconductor substrate I that is an object into which an impurity diffusion ingredient (A) is to be diffused, to form a coating film having a thickness of not more than 30 nm; and
diffusing the impurity diffusion ingredient (A) in the diffusion agent composition into the semiconductor substrate I, wherein
the diffusion agent composition contains the impurity diffusion ingredient (A) and a Si compound (B) that is hydrolyzable to produce a silanol group, and
in coating the diffusion agent composition, an atmosphere around the semiconductor substrate I has a relative humidity of not more than 40%.

2. The method for manufacturing a semiconductor substrate according to claim 1, wherein the atmosphere has a temperature of not more than 23° C.

3. The method for manufacturing a semiconductor substrate according to claim 1, wherein the Si compound (B) is a compound represented by the following formula (1):

$$R_{4-n}Si(NCO)_n \tag{1}$$

wherein $R^1$ represents a hydrocarbon group; and n is an integer of 3 or 4.

4. The method for manufacturing a semiconductor substrate according to claim 3, wherein the coating film has a thickness of 0.2 to 10 nm.

5. The method for manufacturing a semiconductor substrate according to claim 1, wherein the semiconductor substrate I has a three-dimensional structure having convexes and concaves on a surface on which the diffusion agent composition is coated.

6. The method for manufacturing a semiconductor substrate according to claim 1, further comprising rinsing the coating film with an organic solvent.

* * * * *